(12) United States Patent
Umezaki et al.

(10) Patent No.: US 11,373,883 B2
(45) Date of Patent: Jun. 28, 2022

(54) SUBSTRATE PROCESSING APPARATUS, SUBSTRATE PROCESSING SYSTEM AND SUBSTRATE PROCESSING METHOD

(71) Applicant: Tokyo Electron Limited, Tokyo (JP)

(72) Inventors: Shota Umezaki, Kumamoto (JP); Yoshinori Ikeda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 129 days.

(21) Appl. No.: 16/452,895

(22) Filed: Jun. 26, 2019

(65) Prior Publication Data
US 2020/0006092 A1    Jan. 2, 2020

(30) Foreign Application Priority Data

Jun. 29, 2018 (JP) .............................. JP2018-123831

(51) Int. Cl.
| | |
|---|---|
| H01L 21/67 | (2006.01) |
| B05B 1/28 | (2006.01) |
| H01L 21/673 | (2006.01) |
| B05D 3/04 | (2006.01) |
| C23C 16/44 | (2006.01) |
| C23C 16/455 | (2006.01) |
| F26B 21/02 | (2006.01) |

(52) U.S. Cl.
CPC .......... *H01L 21/67051* (2013.01); *B05B 1/28* (2013.01); *B05D 3/0486* (2013.01); *C23C 16/4408* (2013.01); *C23C 16/45519* (2013.01); *C23C 16/45563* (2013.01); *C23C 16/45574* (2013.01); *F26B 21/028* (2013.01); *H01L 21/67023* (2013.01); *H01L 21/67303* (2013.01)

(58) Field of Classification Search
None
See application file for complete search history.

(56) References Cited

U.S. PATENT DOCUMENTS

| | | | | |
|---|---|---|---|---|
| 5,472,502 A | * | 12/1995 | Batchelder | .......... H01L 21/6715 118/52 |
| 6,302,962 B1 | * | 10/2001 | Nam | ....................... C30B 31/12 118/696 |

(Continued)

FOREIGN PATENT DOCUMENTS

| | | |
|---|---|---|
| JP | 2001-237179 A | 8/2001 |
| JP | 2001-319845 A | 11/2001 |

(Continued)

*Primary Examiner* — Jeffrie R Lund
*Assistant Examiner* — Stanislav Antolin
(74) *Attorney, Agent, or Firm* — Abelman, Frayne & Schwab

(57) ABSTRACT

A substrate processing apparatus includes a substrate processing unit, a partition wall, a first gas supply, and a second gas supply. The substrate processing unit performs a liquid processing on a substrate. The partition wall separates a first space defined from a carry-in/out port through which the substrate is loaded to the substrate processing unit, and a second space other than the first space. The first gas supply is connected to the partition wall, and supplies an atmosphere adjusting gas to the first space. The second gas supply is connected to a place different from the first gas supply in the partition wall, and supplies an atmosphere adjusting gas to the first space.

20 Claims, 10 Drawing Sheets

(56) References Cited

U.S. PATENT DOCUMENTS

| | | | | |
|---|---|---|---|---|
| 10,892,176 B2* | 1/2021 | Ikeda | H01L 21/68792 | 156/345.11 |
| 2001/0003964 A1* | 6/2001 | Kitano | G03F 7/162 | 118/50 |
| 2001/0013161 A1* | 8/2001 | Kitano | H01L 21/67778 | 29/25.01 |
| 2001/0014224 A1* | 8/2001 | Hasebe | G03F 7/162 | 396/579 |
| 2001/0035125 A1* | 11/2001 | Talieh | G03F 7/162 | 118/600 |
| 2002/0001679 A1* | 1/2002 | Matsuyama | H01L 21/67178 | 427/446 |
| 2002/0022377 A1* | 2/2002 | Inada | H01L 21/67109 | 438/782 |
| 2002/0053367 A1* | 5/2002 | Kamikawa | H01L 21/67028 | 141/98 |
| 2002/0176936 A1* | 11/2002 | Matsuyama | B05C 11/08 | 427/240 |
| 2003/0010671 A1* | 1/2003 | Orii | C03C 23/0075 | 206/710 |
| 2003/0024645 A1* | 2/2003 | Orii | H01L 21/6708 | 156/345.33 |
| 2003/0079835 A1* | 5/2003 | Kajino | H01L 21/68792 | 156/345.11 |
| 2003/0183960 A1* | 10/2003 | Buazza | B29D 11/00442 | 264/1.38 |
| 2004/0050321 A1* | 3/2004 | Kitano | H01L 21/6715 | 118/300 |
| 2004/0106072 A1* | 6/2004 | Itoh | G03F 7/30 | 430/329 |
| 2005/0100679 A1* | 5/2005 | Kitano | H01L 21/6715 | 427/421.1 |
| 2005/0161599 A1* | 7/2005 | Yoneyama | H01J 37/3023 | 250/306 |
| 2005/0170306 A1* | 8/2005 | Maria Oosterlaken | H01L 21/67126 | 432/241 |
| 2006/0021636 A1* | 2/2006 | Miya | C03C 23/0075 | 134/33 |
| 2007/0022948 A1* | 2/2007 | Rose | H01L 21/67017 | 118/52 |
| 2007/0127916 A1* | 6/2007 | Kitano | H01L 21/67742 | 396/611 |
| 2007/0128356 A1* | 6/2007 | Matsuyama | H01L 21/67778 | 427/240 |
| 2008/0029123 A1* | 2/2008 | Aegerter | H01L 21/67051 | 134/1 |
| 2008/0057219 A1* | 3/2008 | Kim | H01L 21/67051 | 427/534 |
| 2008/0226826 A1* | 9/2008 | Tanaka | H01L 21/6723 | 427/299 |
| 2008/0254224 A1* | 10/2008 | Kishimoto | H01L 21/6708 | 427/427.1 |
| 2008/0280437 A1* | 11/2008 | Tanaka | H01L 21/67051 | 438/678 |
| 2009/0236447 A1* | 9/2009 | Panagopoulos | H01J 37/32449 | 239/548 |
| 2010/0101497 A1* | 4/2010 | Izuta | H01L 21/67051 | 118/730 |
| 2011/0048468 A1* | 3/2011 | Amano | H01L 21/67051 | 134/32 |
| 2011/0200321 A1* | 8/2011 | Takiguchi | H01L 21/67178 | 396/577 |
| 2011/0204490 A1* | 8/2011 | Sato | H01L 21/67253 | 257/632 |
| 2011/0240601 A1* | 10/2011 | Hashizume | H01L 21/76814 | 216/83 |
| 2012/0064256 A1* | 3/2012 | Higashijima | H01L 21/68785 | 427/532 |
| 2012/0064349 A1* | 3/2012 | Sato | B05D 1/005 | 428/411.1 |
| 2013/0011555 A1* | 1/2013 | Sawada | H01L 21/6715 | 427/240 |
| 2013/0052346 A1* | 2/2013 | Higashi | C23C 16/45519 | 427/248.1 |
| 2013/0052347 A1* | 2/2013 | Kuznetsov | H01L 21/67784 | 427/248.1 |
| 2013/0104940 A1* | 5/2013 | Nagamine | H01L 21/6715 | 134/30 |
| 2013/0171831 A1* | 7/2013 | Namba | H01L 21/30604 | 438/748 |
| 2016/0151801 A1* | 6/2016 | Ogura | H01L 21/6715 | 134/30 |
| 2016/0240401 A1* | 8/2016 | Muramoto | H01L 21/6715 | 427/240 |
| 2016/0256901 A1* | 9/2016 | Kobayashi | B05B 1/14 | |
| 2016/0268097 A1* | 9/2016 | Rice | H01L 21/67178 | 396/577 |
| 2016/0281233 A1* | 9/2016 | Granneman | G03F 7/162 | 118/50 |
| 2016/0365260 A1* | 12/2016 | Iwao | G03F 7/162 | 396/579 |
| 2016/0372340 A1* | 12/2016 | Takeaki | H01L 21/67109 | |
| 2017/0162427 A1* | 6/2017 | Gleissner | B08B 3/04 | |
| 2017/0271180 A1* | 9/2017 | Lill | H01L 21/67109 | |
| 2017/0345682 A1* | 11/2017 | Otsuji | H01L 21/67017 | |
| 2019/0074171 A1* | 3/2019 | Harada | H01L 21/02021 | |
| 2019/0221450 A1* | 7/2019 | Negoro | H01L 21/67017 | |
| 2019/0341272 A1* | 11/2019 | Ikeda | H01L 21/67051 | 118/730 |
| 2019/0355593 A1* | 11/2019 | Ikeda | H01L 21/67051 | 134/32 |
| 2020/0006092 A1* | 1/2020 | Umezaki | H01L 21/6708 | 427/427.1 |
| 2020/0234998 A1* | 7/2020 | Kosugi | H01L 21/6708 | 156/345.33 |

FOREIGN PATENT DOCUMENTS

| | | | | |
|---|---|---|---|---|
| JP | 2001319845 A | * | 11/2001 | H01L 21/027 |
| JP | 2003-031538 A | | 1/2003 | |
| JP | 2003-224100 A | | 8/2003 | |
| JP | 2003-282514 A | | 10/2003 | |
| JP | 2019195014 A | * | 11/2019 | H01L 21/6773 |
| JP | 2019201075 A | * | 11/2019 | B05C 11/023 |

* cited by examiner

SUBSTRATE PROCESSING APPARATUS, SUBSTRATE PROCESSING SYSTEM AND SUBSTRATE PROCESSING METHOD

CROSS-REFERENCE TO RELATED APPLICATIONS

This application is based on and claims priority from Japanese Patent Application No. 2018-123831 filed on Jun. 29, 2018 with the Japan Patent Office, the disclosure of which is incorporated herein in its entirety by reference.

TECHNICAL FIELD

The present disclosure relates to a substrate processing apparatus, a substrate processing system, and a substrate processing method.

BACKGROUND

In a substrate processing apparatus of a related art that processes a substrate such as a semiconductor wafer (hereinafter, referred to as a wafer), air atmosphere cleaned by using a fan filter unit (FFU) has been supplied into a casing (see e.g., Japanese Patent Laid-open Publication No. 2001-319845).

SUMMARY

A substrate processing apparatus according to an aspect of the present disclosure includes a substrate processing unit, a partition wall, a first gas supply, and a second gas supply. The substrate processing unit includes a substrate holder configured to mount a substrate and perform a liquid processing on a substrate. The partition wall separates a first space from a carry-in/out port into which the substrate is carried to the substrate processing unit, and a second space other than the first space. The first gas supply is connected to the partition wall, and supplies an atmosphere adjusting gas to the first space. The second gas supply is connected to a place different from the first gas supply in the partition wall, and supplies an atmosphere adjusting gas to the first space.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, an embodiment of a substrate processing apparatus, a substrate processing system, and a substrate processing method according to the present disclosure will be described in detail with reference to accompanying drawings. The present disclosure is not limited by the embodiment described below. It should be noted that the drawings are schematic, and, in some cases, for example, the dimensional relationship of elements, and the ratios of elements are different from those in reality. In some cases, the drawings may include a portion in which a dimensional relationship or a ratio is different between the drawings.

In a substrate processing apparatus of a related art that processes a substrate such as a wafer, air atmosphere cleaned by using a fan filter unit (FFU) has been supplied into a casing.

Meanwhile, in some cases, instead of the air atmosphere, the atmosphere around the wafer may be adjusted to a predetermined condition such as a low humidity or a low oxygen concentration, depending on processings. However, when the atmosphere of the entire inside of the casing is adjusted by using a gas that adjusts the atmosphere to a predetermined condition (hereinafter, referred to as an atmosphere adjusting gas), there is a concern that the usage amount of such an atmosphere adjusting gas may increase.

Therefore, it is expected to reduce the usage amount of the atmosphere adjusting gas when the wafer is processed.

<Outline of Substrate Processing System>

Figure 1:
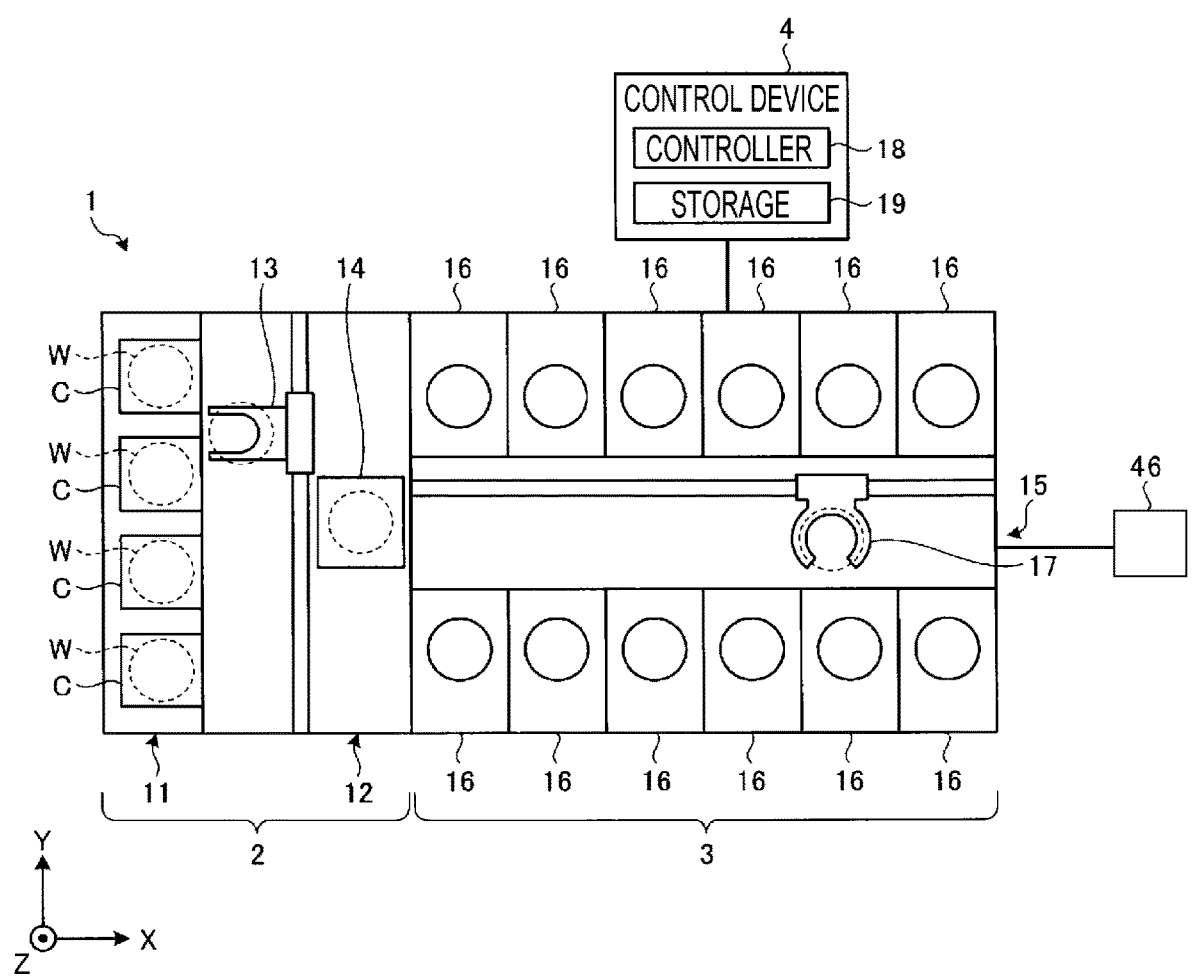
FIG. 1 is a schematic view illustrating a schematic configuration of a substrate processing system according to an embodiment.

First, descriptions will be made on a schematic configuration of a substrate processing system 1 according to the embodiment with reference to FIG. 1. FIG. 1 is a schematic view illustrating a schematic configuration of the substrate processing system 1 according to the embodiment. In the following, in order to clarify positional relationships, the X axis, the Y axis and the Z axis which are orthogonal to each other will be defined, and the positive direction of the Z axis will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 includes a carrier placing section 11 and a conveyance section 12. In the carrier placing section 11, carriers C are placed to horizontally accommodate a plurality of substrates, that is, semiconductor wafers W in the embodiment (hereinafter, referred to as wafers W). The wafer W is an example of a substrate.

The conveyance section 12 is provided adjacent to the carrier placing section 11, and includes a substrate conveyance device 13 and a delivery unit 14 therein. The substrate conveyance device 13 includes a wafer holding mechanism that holds the wafer W. The substrate conveyance device 13 is movable horizontally and vertically and pivotable around a vertical axis, and conveys the wafers W between the carriers C and the delivery unit 14 by using the wafer holding mechanism.

The processing station 3 is provided adjacent to the conveyance section 12. The processing station 3 includes a conveyance section 15 and processing units 16. The processing units 16 are provided side by side on both sides of the conveyance section 15. The conveyance section 15 is an example of a common conveyance path, and the processing unit 16 is an example of a substrate processing apparatus.

The conveyance section 15 includes a substrate conveyance device 17 therein. The substrate conveyance device 17 is an example of a conveyance mechanism, and includes a wafer holding mechanism that holds the wafer W. The substrate conveyance device 17 is movable horizontally and vertically and pivotable around a vertical axis, and conveys the wafers W between the delivery unit 14 and the processing units 16 by using the wafer holding mechanism.

The processing unit 16 performs a predetermined liquid processing on the wafer W conveyed by the substrate conveyance device 17. Details of the processing unit 16 will be described below.

The substrate processing system 1 includes a control device 4. The control device 4 is, for example, a computer, and includes a controller 18 and a storage 19. The storage 19 stores a program that controls various processings to be executed in the substrate processing system 1. The controller 18 controls operations of the substrate processing system 1 by reading and executing the program stored in the storage 19.

Such a program may be recorded in a computer-readable recording medium, and then installed from the recording medium to the storage 19 of the control device 4. The computer-readable recording medium may be, for example, a hard disk (HD), a flexible disk (FD), a compact disc (CD), a magneto optical disk (MO), or a memory card.

In the substrate processing system 1 configured as described above, first, the substrate conveyance device 13 of the carry-in/out station 2 takes out the wafer W from the carrier C placed in the carrier placing section 11, and places the taken-out wafer W on the delivery unit 14. The wafer W placed on the delivery unit 14 is taken out of the delivery unit 14 by the substrate conveyance device 17 of the processing station 3, and is carried into the processing unit 16.

The wafer W carried into the processing unit 16 is processed by the processing unit 16, and then carried out of the processing unit 16 by the substrate conveyance device 17, and placed on the delivery unit 14. Then, the processed wafer W that is placed on the delivery unit 14 is returned to the carrier C of the carrier placing section 11 by the substrate conveyance device 13.

<Outline of Processing Unit>

Figure 2:
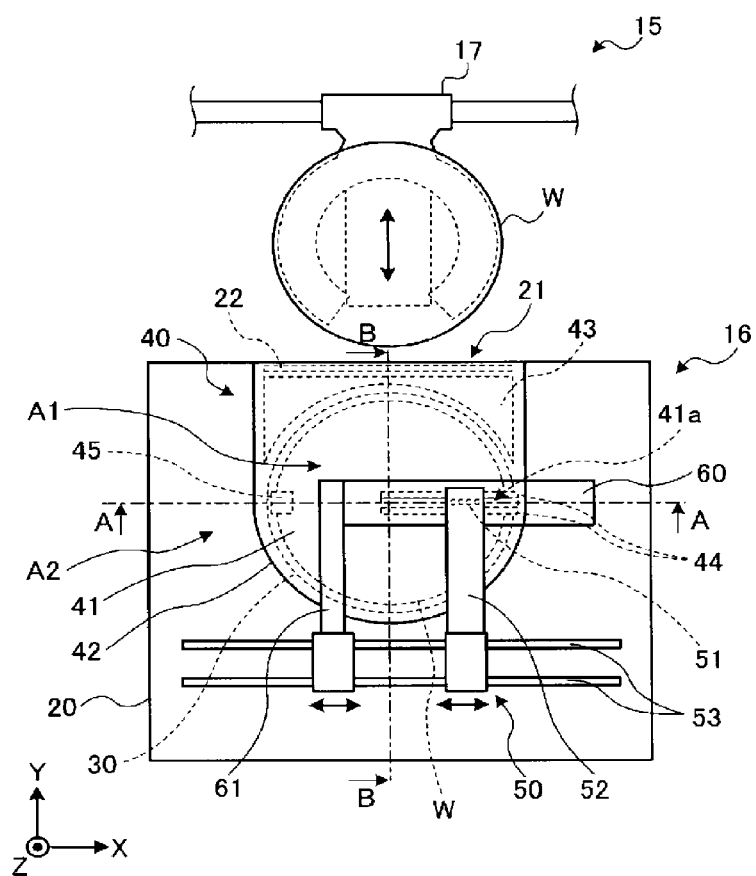
FIG. 2 is a top view illustrating a configuration of a processing unit according to the embodiment.
Figure 3:
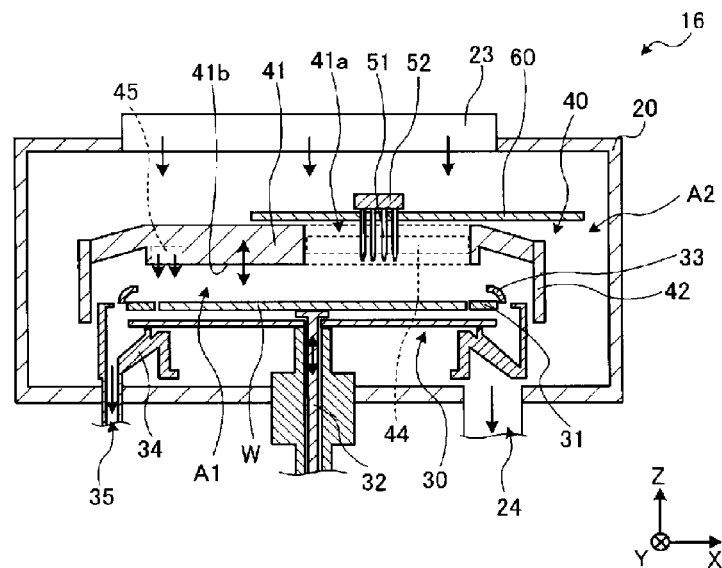
FIG. 3 is a sectional view taken along line A-A in FIG. 2.
Figure 4:
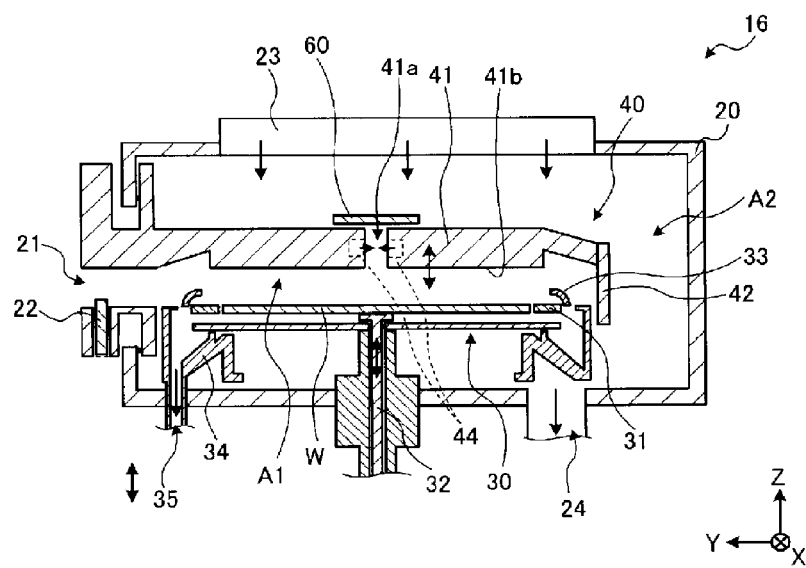
FIG. 4 is a sectional view taken along line B-B in FIG. 2.

Next, descriptions will be made on the outline of the processing unit 16 with reference to FIGS. 2 to 4. FIG. 2 is a top view illustrating a configuration of the processing unit 16 according to the embodiment, FIG. 3 is a sectional view taken along line A-A in FIG. 2, and FIG. 4 is a sectional view taken along line B-B in FIG. 2. For ease in understanding, FIG. 3 and FIG. 4 illustrate a state where the wafer W is loaded, and in FIG. 4, illustration of a linear motion (LM) guide 53 is omitted.

As illustrated in FIG. 2, the processing unit 16 includes a casing 20, a substrate processing unit 30, a partition wall 40, a liquid supply 50, and a scan top plate 60. The casing 20 accommodates the substrate processing unit 30, the partition wall 40, the liquid supply 50, and the scan top plate 60.

The casing 20 has a carry-in/out port 21 at a position in contact with the conveyance section 15. Then, the wafer W conveyed by the substrate conveyance device 17 of the conveyance section 15 is carried into the casing 20 from such a carry-in/out port 21. The casing 20 has a shutter 22 that is configured to be capable of opening and closing such a carry-in/out port 21.

In the embodiment, descriptions are made on an example in which such a shutter 22 is incorporated in the partition wall 40 to be described below, but the shutter 22 need not be necessarily incorporated in the partition wall 40.

As illustrated in FIG. 3 and FIG. 4, an FFU 23 is provided on the ceiling of the casing 20. The FFU 23 forms a downflow of cleaned air atmosphere to be supplied into the casing 20. An exhaust port 24 is formed on the bottom of the casing 20 to exhaust the air atmosphere supplied from the FFU 23 to the outside of the processing unit 16.

The substrate processing unit 30 performs a predetermined liquid processing on the wafer W. As illustrated in FIG. 3 and FIG. 4, the substrate processing unit 30 includes a substrate holder 31, a support 32, a liquid receiving cup 33, a recovery cup 34, and a drainage port 35. The substrate holder 31 horizontally holds the wafer W. Such a substrate holder 31 holds, for example, the outer edge of the wafer W from the side.

The support 32 is a member that extends in the vertical direction, and has a lower-side base end rotatably supported by a drive unit (not illustrated). Although not illustrated in FIG. 3 and FIG. 4, the support 32 may horizontally support the substrate holder 31, at an upper-side tip end thereof.

Then, the substrate processing unit 30 rotates the support 32 by using the drive unit so that the substrate holder 31 supported by the support 32 is rotated. Accordingly, the substrate processing unit 30 rotates the wafer W held by the substrate holder 31. The support 32 is configured to be vertically movable, and may move toward the wafer W loaded at a position above the substrate processing unit 30 and receive the wafer W.

The liquid receiving cup 33 has a substantially annular shape, and a curved shape that is recessed downward. The liquid receiving cup 33 is disposed to surround the outer edge of the substrate holder 31, and collects a processing liquid scattering from the wafer W by the rotation of the substrate holder 31, such as a chemical liquid L1 (see FIG. 6F) or a rinse liquid L2 (see FIG. 6G).

For example, the liquid receiving cup 33 is disposed to surround the outer edge of the substrate holder 31 at least above the same plane as the wafer W held by the substrate holder 31. The liquid receiving cup 33 may rotate together with the substrate holder 31.

The recovery cup 34 is disposed to surround the substrate holder 31, and collects a processing liquid scattering from the wafer W by the rotation of the substrate holder 31.

Although not illustrated in FIG. 3 and FIG. 4, the recovery cup 34 may be a multi-cup capable of collecting each of processing liquids.

The drainage port 35 is formed on the bottom of such a recovery cup 34. Then, the processing liquid collected by the liquid receiving cup 33 or the recovery cup 34 is discharged from such a drainage port 35 to the outside of the processing unit 16.

As illustrated in FIG. 4, by the partition wall 40, the inside of the casing 20 is partitioned into a first space A1 from the above described carry-in/out port 21 to the substrate processing unit 30, and a second space A2 other than such a first space A1. The partition wall 40 is configured to be capable of adjusting the atmosphere within the separate first space A1 to a predetermined condition.

As illustrated in FIG. 3, the partition wall 40 includes a top plate 41, a side wall 42, a gap filling portion 43 (see FIG. 2), a first gas supply 44, and a second gas supply 45. The top plate 41 has a substantially disk-like shape, is provided to face the wafer W held by the substrate holder 31 substantially in parallel to the wafer W, and is disposed to cover the top side of the wafer W.

The top plate 41 is configured to be vertically movable in the casing 20, and moves upwards so as not to interfere with a conveyance path of the wafer W when the wafer W is loaded and unloaded through the carry-in/out port 21. Meanwhile, when the wafer W is processed in the substrate processing unit 30, the top plate 41 moves to a lower position close to the wafer W. The arrangement of the top plate 41 is not limited to the above described position, and may be freely changed according to a condition for processing the wafer W or a condition for cleaning the top plate 41.

A vertically communicating through hole 41a is formed in the top plate 41. For example, as illustrated in FIG. 2 and FIG. 3, such a through hole 41a has a slit shape, and is formed to face at least a central portion of the wafer W held by the substrate holder 31. The through hole 41a is formed allowing processing liquid nozzles 51 to be described below to be inserted through the through hole 41a.

As illustrated in FIG. 4, the top plate 41 has a convex portion 41b that protrudes toward the wafer W. Such a convex portion 41b protrudes in, for example, a substantially cylindrical shape. Then, the outer diameter of the convex portion 41b is larger than the outer diameter of the facing wafer W, and is smaller than the inner diameter of the adjacent liquid receiving cup 33.

The side wall 42 surrounds the sides of, for example, the substrate holder 31 holding the wafer W, the liquid receiving cup 33, and the top plate 41. For example, as illustrated in FIG. 2, the side wall 42 has a shape in which the front side where the carry-in/out port 21 is present has a linear shape in top view, and the back side where the wafer W is subjected to a liquid processing has a semicircular shape along the shape of the wafer W.

In the embodiment, the side wall 42 is vertically movable integrally with the top plate 41. Meanwhile, the side wall 42 need not vertically move together with the top plate 41, and may be fixed within the casing 20. In this case, the top plate 41 may be configured to be vertically movable along the fixed side wall 42.

As illustrated in FIG. 2, the gap filling portion 43 fills a gap (e.g., the periphery of the carry-in/out port 21) other than the substrate processing unit 30 in the first space A1 when the wafer W is processed in the substrate processing unit 30. In the embodiment, the gap filling portion 43 is vertically movable integrally with the top plate 41, and moves to a position not interfering with the conveyance path of the wafer W when the wafer W is loaded and unloaded through the carry-in/out port 21.

The gap filling portion 43 substantially has, for example, a U-shape with an arc-shaped inside and a rectangular outside in top view. The side wall 42 need not vertically move together with the top plate 41, and may be vertically movable independently of the top plate 41.

The first gas supply 44 is connected to the first space A1, and supplies an atmosphere adjusting gas to such a first space A1. For example, as illustrated in FIG. 4, discharge nozzles of the atmosphere adjusting gas in the first gas supply 44 are connected to side walls of the through hole 41a formed in the top plate 41. Then, the first gas supply 44 supplies the atmosphere adjusting gas to the first space A1 via the through hole 41a from such discharge nozzles.

The second gas supply 45 is connected to a place different from the first gas supply 44 in the first space A1, and supplies the atmosphere adjusting gas to such a first space A1. For example, as illustrated in FIG. 2 and FIG. 3, discharge nozzles of the atmosphere adjusting gas in the second gas supply 45 are connected to a position farthest from the outer periphery of the wafer W facing the slit-shaped through hole 41a among positions facing the outer periphery of the wafer W.

Then, the second gas supply 45 supplies the atmosphere adjusting gas from such discharge nozzles toward the outer periphery of the wafer W. Such an atmosphere adjusting gas may be supplied from a third gas supply 46 provided in the conveyance section 15, via such a conveyance section 15.

The atmosphere adjusting gas in the embodiment is, for example, an inert gas having a lower oxygen concentration than the air atmosphere such as, for example, a nitrogen gas or an Ar gas, or a gas having a lower humidity than the air atmosphere such as a drying gas.

The liquid supply 50 illustrated in FIG. 2 supplies the processing liquid such as the chemical liquid L1 or the rinse liquid L2 to the wafer W held in the first space A1. The liquid supply 50 includes the processing liquid nozzles 51, an arm 52, and the LM guide 53, and is disposed in the second space A2.

The processing liquid nozzles 51 are connected to a processing liquid supply source via a valve and a flow rate controller (not illustrated), and discharge the processing liquid to the wafer W by using the through hole 41a formed in the top plate 41.

The processing liquid discharged from the processing liquid nozzles 51 includes various liquids used for various liquid processings of the wafer W, such as, for example, an acid-based processing liquid, an alkaline-based processing liquid, an organic-based processing liquid, or a rinse liquid. The acid-based processing liquid is, for example, diluted hydrofluoric acid (DHF).

The alkaline-based processing liquid is, for example, SC1 (a mixed solution of ammonia, hydrogen peroxide, and water). The organic-based processing liquid is, for example, isopropyl alcohol (IPA). The rinse liquid is, for example, deionized water (DIW).

The arm 52 supports the processing liquid nozzles 51. The LM guide 53 guides the arm 52 in the X axis direction. Then, the arm 52 guided by the LM guide 53 slides along the LM guide 53 together with the processing liquid nozzles 51 by a driving force transferred from a drive unit (not illustrated) included in the LM guide 53. Accordingly, it is possible to slide the processing liquid nozzles 51 to a predetermined position within the casing 20.

The arm 52 includes a lift mechanism (not illustrated). Then, the liquid supply 50 may raise and lower the processing liquid nozzles 51 by operating such a lift mechanism.

As described above, by operating the LM guide 53 and the lift mechanism, the liquid supply 50 may cause the processing liquid nozzles 51 to move to a position of the through hole 41a, and to be inserted through such a through hole 41a.

In the embodiment, since the through hole 41a has a slit shape, and the extension direction of the LM guide 53 is substantially parallel to the extension direction of the through hole 41a, the processing liquid nozzles 51 may be scan-moved within the through hole 41a.

The example illustrated in FIG. 2 illustrates a case where the processing liquid nozzles 51 are fixed to the arm 52, but the present disclosure is not limited to the case where the processing liquid nozzles 51 are fixed to the arm 52. For example, the processing liquid nozzles 51 may be, for example, pick-up type nozzles in which such processing liquid nozzles 51 are grasped and moved by the arm 52. A mechanism that slides the arm 52 is not limited to the LM guide 53, and conventionally known various mechanisms may be used.

The scan top plate 60 is disposed to cover the upper side of the through hole 41a and to extend along the extension direction of the through hole 41a. Due to such a scan top plate 60, it is possible to suppress the inflow of the air atmosphere from the second space A2 to the first space A1.

Figure 5:
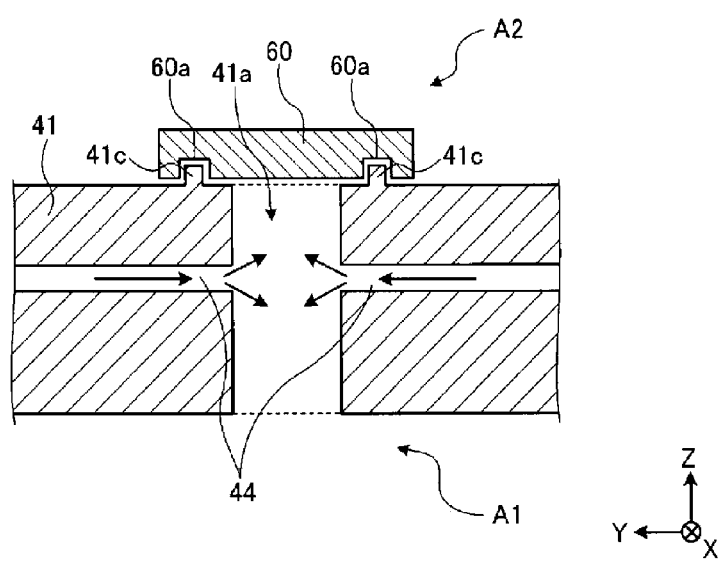
FIG. 5 is a schematic view for explaining a configuration of a top plate and a scan top plate according to the embodiment.

In the embodiment, as illustrated in FIG. 5, a gap between the top plate 41 and the scan top plate 60 may have a labyrinth structure. FIG. 5 is a schematic view for explaining a configuration of the top plate 41 and the scan top plate 60 according to the embodiment.

Such a labyrinth structure is a structure where a convex portion 41c formed on the top surface of the top plate 41 and a concave portion 60a formed on the bottom surface of the scan top plate 60 mesh with each other without being in contact with each other. Since such a labyrinth structure may cause occurrence of a pressure loss in the gap between the top plate 41 and the scan top plate 60, it is possible to further suppress the inflow of the air atmosphere from the second space A2 to the first space A1.

Such a labyrinth structure is not limited to a combination of the convex portion 41c formed on the top surface of the top plate 41 and the concave portion 60a formed on the bottom surface of the scan top plate 60. For example, such a labyrinth structure may be a combination of a concave portion formed on the top surface of the top plate 41 and a convex portion formed on the bottom surface of the scan top plate 60.

In the scan top plate 60, through holes 60b (see FIG. 6C) are formed allowing the processing liquid nozzles 51 to be inserted through the through holes 60b, respectively. Accordingly, via such through holes 60b, the liquid supply 50 may cause the processing liquid nozzles 51 to be inserted through the through hole 41a.

As illustrated in FIG. 2, the scan top plate 60 is supported by an arm 61. The above described LM guide 53 guides such an arm 61 in the X axis direction. Then, the arm 61 guided by the LM guide 53 slides along the LM guide 53 together with the scan top plate 60 by a driving force transferred from the drive unit (not illustrated) included in the LM guide 53. Accordingly, it is possible to slide the scan top plate 60 to a predetermined position within the casing 20.

The arm 61 includes a lift mechanism (not illustrated). Then, the arm 61 may raise and lower the scan top plate 60 by operating such a lift mechanism.

As described above, the scan top plate 60 may move in the second space A2 in the same direction as the processing liquid nozzles 51, and thus may move in the second space A2 in synchronization with the processing liquid nozzles 51.

<Details of Liquid Processing>

Subsequently, descriptions will be made on details of a liquid processing according to the embodiment with reference to FIGS. 6A to 6H. FIGS. 6A to 6H are schematic views (1) to (8) illustrating one process of the liquid processing according to the embodiment.

Figure 6A:
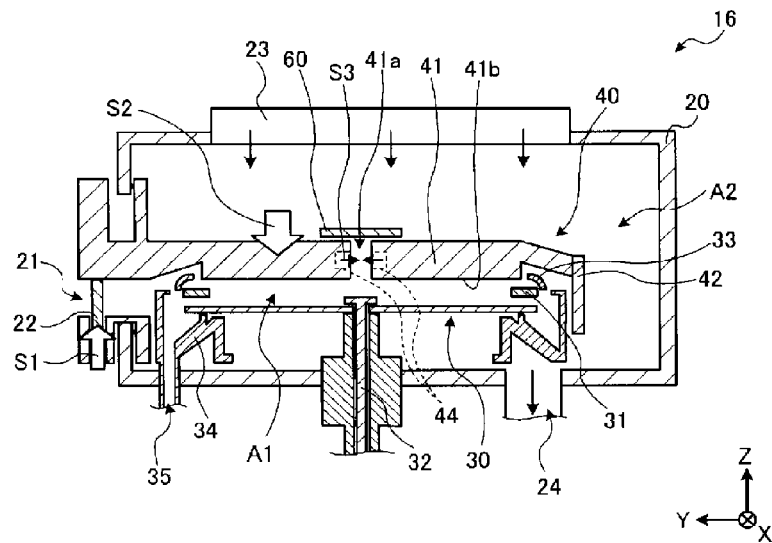
FIG. 6A is a schematic view (1) illustrating one process of a liquid processing according to the embodiment.
Figure 6B:
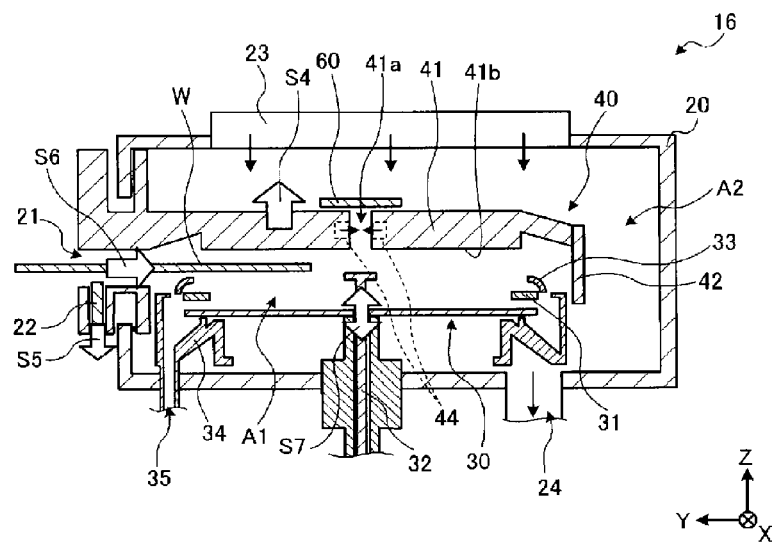
FIG. 6B is a schematic view (2) illustrating one process of the liquid processing according to the embodiment.

As illustrated in FIG. 6A, in a state before the wafer W is carried into the processing unit 16, the shutter 22 is closed (step S1), and the top plate 41 is moved downwards (step S2). Then, in this state, the first gas supply 44 and the second gas supply 45 (see FIG. 3) supply an atmosphere adjusting gas to the first space A1 (step S3). Accordingly, the wafer W may be carried into the first space A1 in which the atmosphere is adjusted to a predetermined condition.

In the embodiment, when replacement by the atmosphere adjusting gas in the first space A1 is made in advance, the substrate holder 31 may be rotated in the first space A1. Accordingly, since it is possible to suppress atmosphere other than the atmosphere adjusting gas from staying in the first space A1, it is possible to efficiently perform replacement by the atmosphere adjusting gas in the first space A1.

Meanwhile, the second space A2 of the processing unit 16 has air atmosphere cleaned using the FFU 23. Then, the atmosphere adjusting gas supplied to the first space A1, and the air atmosphere supplied to the second space A2 are exhausted at the exhaust port 24 in common.

Figure 6C:
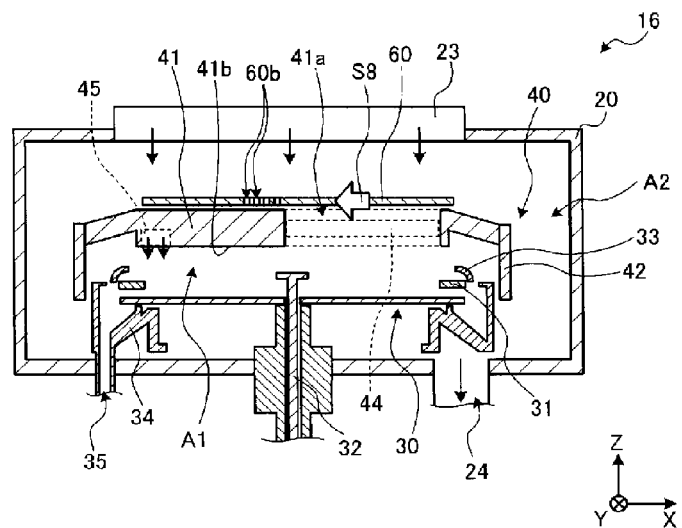
FIG. 6C is a schematic view (3) illustrating one process of the liquid processing according to the embodiment.
Figure 6D:
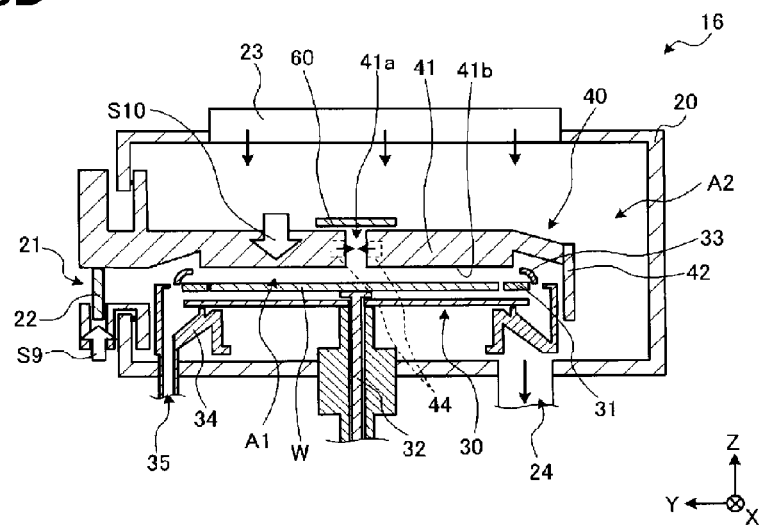
FIG. 6D is a schematic view (4) illustrating one process of the liquid processing according to the embodiment.
Figure 6E:
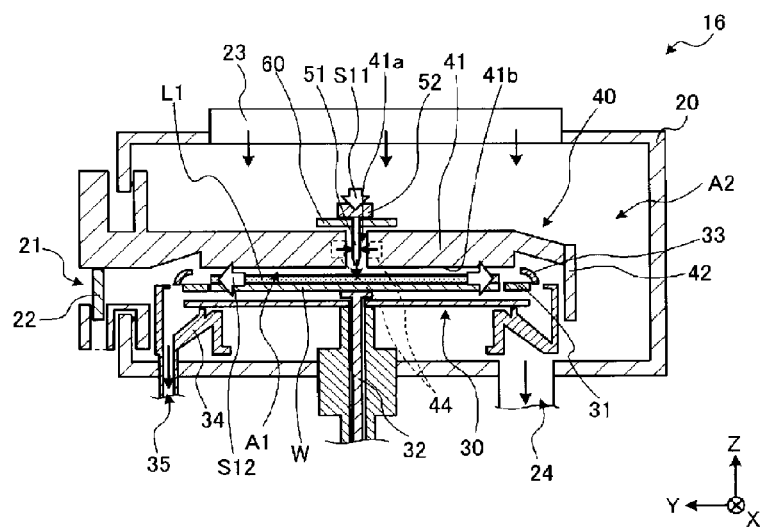
FIG. 6E is a schematic view (5) illustrating one process of the liquid processing according to the embodiment.

Next, as illustrated in FIG. 6E, in the processing unit 16, before the wafer W is carried into the substrate processing unit 30, a conveyance path of the wafer W is secured in the first space A1. Specifically, the processing unit 16 retracts the top plate 41 upwards from the conveyance path of the wafer W (step S4).

Next, the processing unit 16 opens the carry-in/out port 21 by moving the shutter 22 (step S5), and the substrate conveyance device 17 (see FIG. 2) carries the wafer W into the processing unit 16 (step S6). Then, the processing unit 16 receives the wafer W loaded at a position above the substrate holder 31 by the support 32 moved upwards, and then moves the wafer W downwards so that the wafer W is held by the substrate holder 31 (step S7).

At the time of such a carrying-in processing of the wafer W, as illustrated in FIG. 6C, the scan top plate 60 is moved to a position where the through holes 60b are blocked by the top plate 41 (step S8). Specifically, the scan top plate 60 is moved to a position where the through holes 60b of the scan top plate 60 do not communicate with the through hole 41a of the top plate 41.

Accordingly, at the time of the carrying-in processing of the wafer W, it is possible to suppress the inflow of the air atmosphere from the second space A2 to the first space A1 via the through holes 60b. This step S8 may be performed in a state before the wafer W is loaded as illustrated in FIG. 6A.

At the time of the carrying-in processing of the wafer W, the atmosphere adjusting gas is supplied to the first space A1 from the above described third gas supply via the conveyance section 15 and the carry-in/out port 21. Accordingly, within the processing unit 16 into which the wafer W is being carried, the atmosphere of the first space A1 may be continuously adjusted to the predetermined condition.

Next, as illustrated in FIG. 6D, the processing unit 16 closes the carry-in/out port 21 by moving the shutter 22 (step S9). The processing unit 16 causes the top plate 41 to move downwards and approach the wafer W (step S10).

For example, in this step S10, the top plate 41 is brought close to a position where a gap between the top plate 41 and the wafer W ranges from about 1 mm to 4 mm. In this manner, by causing the top plate 41 to approach the wafer W, it is possible to fill a gap in the first space A1 with the gap filling portion 43 provided in the top plate 41.

In the embodiment, during these steps S9 and S10, the processing unit 16 continuously supplies a predetermined atmosphere adjusting gas to the first space A1 by operating the first gas supply 44 and the second gas supply 45. Accordingly, it is possible to continuously adjust the atmosphere of the first space A1 where the wafer W is disposed to the predetermined condition.

Next, as illustrated in FIG. 6E, the processing unit 16 operates the liquid supply 50 and the scan top plate 60 so that the processing liquid nozzles 51 are moved to a predetermined position above the wafer W and inserted through the through holes 60b (see FIG. 6C) and the through hole 41a (step S11). Then, the processing unit 16 supplies the chemical liquid L1 as an example of a processing liquid to the wafer W by operating the processing liquid nozzles 51 (step S12).

Figure 6F:
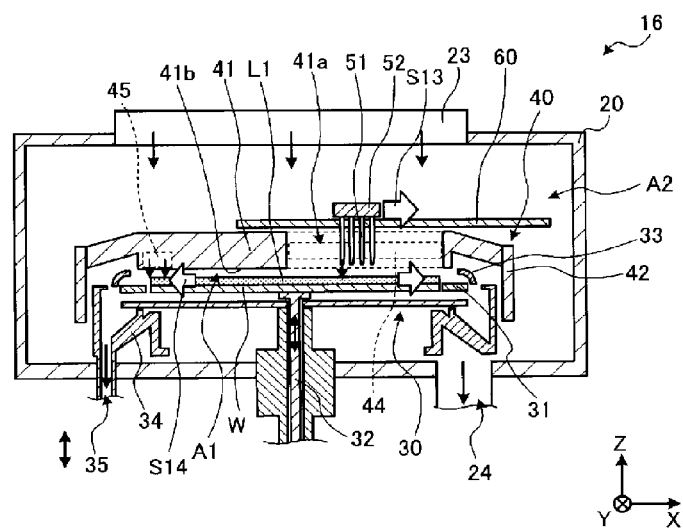
FIG. 6F is a schematic view (6) illustrating one process of the liquid processing according to the embodiment.

Next, as illustrated in FIG. 6F, the processing unit 16 causes the processing liquid nozzles 51 to perform scanning above the wafer W by operating the liquid supply 50 and the scan top plate 60 (step S13). When the processing liquid nozzles 51 perform scanning above the wafer W, the scan top plate 60 performs scanning in synchronization with the processing liquid nozzles 51.

Then, the processing unit 16 rotates the wafer W by operating the substrate processing unit 30 so that the chemical liquid L1 is moved to the outer periphery side of the wafer W, and the wafer W is subjected to the liquid processing (step S14). At the time of such a liquid processing by the chemical liquid L1, the gap between the top plate 41 and the wafer W is not yet filled with the chemical liquid L1.

In the embodiment, during these steps S11 to S14, the processing unit 16 continuously supplies the predetermined atmosphere adjusting gas to the first space A1 by operating the first gas supply 44 and the second gas supply 45.

Here, in the embodiment, the atmosphere adjusting gas may be evenly supplied to the first space A1 from the first gas supply 44 and the second gas supply 45 connected to different places at the top plate 41. Accordingly, it is possible to effectively continuously adjust the atmosphere around the wafer W being subjected to the liquid processing to the predetermined condition.

Then, in the embodiment, the air atmosphere is supplied to the second space A2 in the casing 20, and the atmosphere adjusting gas is supplied only to the first space A1 separated by the partition wall 40. Therefore, according to the embodiment, at the time of the liquid processing of the wafer W, it is possible to reduce the usage amount of the atmosphere adjusting gas.

Here, descriptions will be made on results related to a comparative experiment in which a case where the atmosphere adjusting gas is supplied from one place of the top plate 41 is compared to a case where the atmosphere adjusting gas is supplied from the first gas supply 44 and the second gas supply 45 connected to two different places of the top plate 41.

In Reference example, while the wafer W is rotated, 200 L/min of nitrogen gas as an example of the atmosphere adjusting gas was supplied only from the first gas supply 44 connected to a position above the central portion of the wafer W. As a result, the oxygen concentration of the first space A1 was 1% or more at most.

Meanwhile, in Example, while the wafer W is rotated, 130 L/min of nitrogen gas was supplied from the first gas supply 44 connected to a position above the central portion of the wafer W, and 80 L/min was supplied from the second gas supply 45 connected to a positon above the peripheral edge of the wafer W. As a result, it was possible to reduce the oxygen concentration of the first space A1 to 0.01% or less.

As described above, in the embodiment, since the atmosphere adjusting gas may be evenly supplied to the first space A1 from the first gas supply 44 and the second gas supply 45, it is possible to effectively continuously adjust the atmosphere around the wafer W to the predetermined condition.

In the embodiment, the first gas supply 44 and the second gas supply 45 may be connected to positions in the partition wall 40 facing the wafer W (that is, positions in the top plate 41 facing the wafer W). Accordingly, it is possible to efficiently supply the atmosphere adjusting gas to the vicinity of the wafer W for which the atmosphere needs to be adjusted.

In the embodiment, the first gas supply 44 is connected to the top plate 41 above the central portion of the wafer W, and the second gas supply 45 is connected to the top plate 41 above the outer periphery of the wafer W. Accordingly, it is possible to more evenly supply the atmosphere adjusting gas to the first space A1. Therefore, according to the embodiment, it is possible to more effectively continuously adjust the atmosphere around the wafer W being subjected to the liquid processing to the predetermined condition.

In the embodiment, it is possible to narrow the first space A1 by causing the top plate 41 to approach the wafer W and filling the gap of the first space A1 with the gap filling portion 43. Therefore, according to the embodiment, it is possible to further reduce the usage amount of the atmosphere adjusting gas.

In the embodiment, the inner diameter of the liquid receiving cup 33 may be larger than the outer diameter of the convex portion 41b of the top plate 41. Accordingly, as illustrated in, for example, FIG. 6E, it is possible to cause the top plate 41 to approach the wafer W without interfering with the liquid receiving cup 33. Therefore, according to the embodiment, since the first space A1 may be narrowed, it is possible to further reduce the usage amount of the atmosphere adjusting gas.

In the embodiment, the through hole 41a may be formed to face at least the central portion of the wafer W held by the substrate holder 31. Accordingly, since the processing liquid nozzles 51 may be disposed above the central portion of the wafer W, it is possible to discharge the processing liquid toward the central portion of the wafer W. Therefore, according to the embodiment, it is possible to uniformly supply the processing liquid to the entire surface of the wafer W.

Figure 6G:
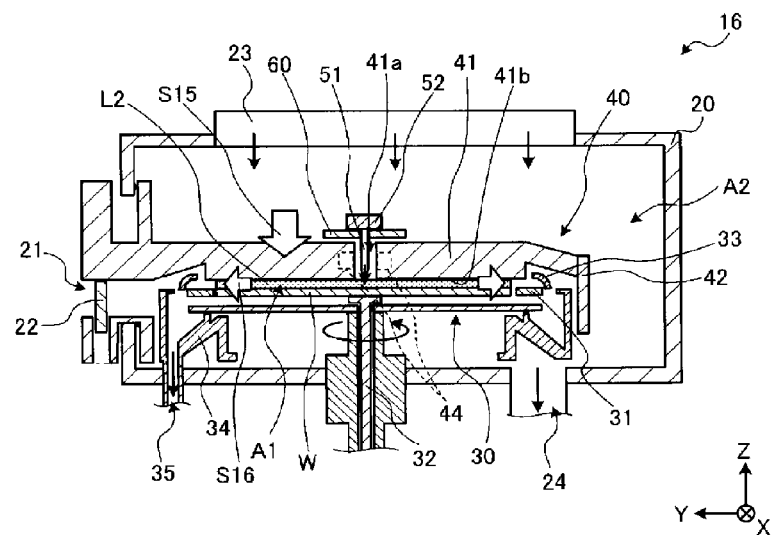
FIG. 6G is a schematic view (7) illustrating one process of the liquid processing according to the embodiment.

The continuation of the processing in the processing unit 16 will be described. Next, as illustrated in FIG. 6G, the processing unit 16 further moves the top plate 41 downwards so that the top plate 41 is brought closer to the wafer W (step S15). For example, in this step S15, the top plate 41 is brought close to a position where the gap between the top plate 41 and the wafer W ranges about 1 mm to 4 mm. In this step S15, the scan top plate 60 and the processing liquid nozzles 51 may also be moved downwards in synchronization with the top plate 41.

Next, the processing unit 16 supplies the rinse liquid L2 as another example of the processing liquid to the wafer W by operating the processing liquid nozzles 51 (step S16). Although not illustrated in FIG. 6G, in this step S16, the processing liquid nozzles 51 may perform scanning above the wafer W in the same manner as in the above described step S13.

Then, the processing unit 16 rotates the wafer W by operating the substrate processing unit 30 so that the rinse liquid L2 is moved to the outer periphery side of the wafer W and the wafer W is rinsed.

At the time of such a liquid processing by the rinse liquid L2, the top plate 41 may be brought in contact with the rinse liquid L2, and the gap between the top plate 41 and the wafer W may be filled with the rinse liquid L2. Accordingly, it is possible to wash away the chemical liquid L1 adhering to the top plate 41 in the above described steps S12 to S14, by the rinse liquid L2.

Next, in the same manner as in step S16, the processing unit 16 supplies IPA as a separate example of the processing liquid to the wafer W by operating the processing liquid nozzles 51 in a state where the top plate 41 is brought close to the wafer W. Then, the processing unit 16 rotates the wafer W by operating the substrate processing unit 30 so that the IPA is moved to the outer periphery side of the wafer W, and the wafer W is spin-dried.

At the time of such spin-drying by the IPA, the top plate 41 may be brought in contact with the IPA, and the gap between the top plate 41 and the wafer W may be filled with the IPA. Accordingly, it is possible to dry the rinse liquid L2 adhering to the top plate 41 in the above described step S16, by the IPA.

When the top plate 41 is brought in contact with the processing liquid such as the rinse liquid L2 or the IPA, the supply of the atmosphere adjusting gas from the first gas supply 44 and the second gas supply 45 may be stopped. Accordingly, it is possible to suppress the processing liquid in contact with the top plate 41 from waving due to discharging of the atmosphere adjusting gas, and from causing a hindrance to the liquid processing.

In the embodiment, even when the gap between the top plate 41 and the wafer W is filled with the processing liquid, it is possible to move the processing liquid on the surface of the top plate 41 to the outer periphery side together with the processing liquid on the surface of the wafer W by starting the rotation of the wafer W at a relatively low speed, and gradually increasing the rotation speed. Accordingly, in the embodiment, it is possible to suppress the processing liquid from remaining on the surface of the top plate 41 after the liquid processing.

In the embodiment, as illustrated in, for example, FIG. 6G, the outer diameter of the convex portion 41b of the top plate 41 may be larger than the outer diameter of the wafer W. Accordingly, even when the processing liquid remains on the outer edge of the convex portion 41b after the liquid processing, it is possible to suppress such a remaining processing liquid from adhering to the wafer W.

When the processing liquid remains on the outer edge of the convex portion 41b after the liquid processing, such a processing liquid remaining on the outer edge may be purged by, for example, the atmosphere adjusting gas.

Figure 6H:
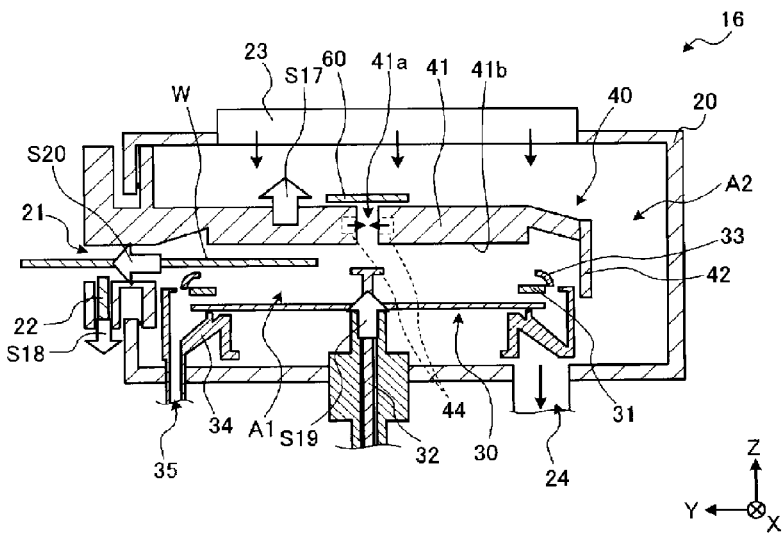
FIG. 6H is a schematic view (8) illustrating one process of the liquid processing according to the embodiment.

The continuation of the processing in the processing unit 16 will be described. As illustrated in FIG. 6H, after the liquid processing is completed, the processing unit 16 retracts the top plate 41 upwards from the conveyance path of the wafer W (step S17), so as to secure the conveyance path of the wafer W in the first space A1.

Next, the shutter 22 is moved to open the carry-in/out port 21 (step S18), and the support 32 is operated upwards together with the wafer W (step S19). Then, the wafer W is carried out of the processing unit 16 by using the substrate conveyance device 17 (step S20).

Then, after the wafer W is unloaded, the processing unit 16 closes the shutter 22 and moves the top plate 41 downwards as illustrated in FIG. 6A. Finally, the supply of the atmosphere adjusting gas by the first gas supply 44 and the second gas supply 45 is stopped.

As described above, it is possible to further reduce the usage amount of the atmosphere adjusting gas by stopping the supply of the atmosphere adjusting gas to the first space A1 from which the wafer W is unloaded.

In the embodiment, as illustrated in FIG. 5, for example, the atmosphere adjusting gas is discharged from the pair of first gas supplies 44 facing each other in the through hole 41a. Accordingly, it is possible to form a gas curtain within the through hole 41a.

Therefore, according to the embodiment, since the inflow of the air atmosphere from the second space A2 to the first space A1 may be suppressed, it is possible to satisfactorily keep the first space A1 in the atmosphere adjusted to the predetermined condition.

The substrate processing apparatus (the processing unit 16) according to the embodiment includes the substrate processing unit 30, the partition wall 40, the first gas supply 44, and the second gas supply 45. The substrate processing unit 30 performs a liquid processing on the substrate (the wafer W). The partition wall 40 separates the first space A1 from the carry-in/out port 21 through which the substrate (the wafer W) is loaded to the substrate processing unit 30, from the second space A2 other than the first space A1. The first gas supply 44 is connected to the partition wall 40, and supplies an atmosphere adjusting gas that adjusts atmosphere to the first space A1. The second gas supply 45 is connected to a place different from the first gas supply 44 in the partition wall 40, and supplies the atmosphere adjusting gas to the first space A1. Accordingly, at the time of the liquid processing of the wafer W, it is possible to reduce the usage amount of the atmosphere adjusting gas.

In the substrate processing apparatus (the processing unit 16) according to the embodiment, the first gas supply 44 and the second gas supply 45 are connected to positions in the partition wall 40 facing the substrate (the wafer W). Accordingly, it is possible to efficiently supply the atmosphere adjusting gas to the vicinity of the wafer W for which the atmosphere needs to be adjusted.

In the substrate processing apparatus (the processing unit 16) according to the embodiment, the partition wall 40 includes the top plate 41 covering the top side of the substrate (the wafer W), and the side wall 42 surrounding the lateral side of the substrate (the wafer W). Then, the first gas supply 44 and the second gas supply 45 are connected to the top plate 41. Accordingly, it is possible to efficiently supply the atmosphere adjusting gas to the vicinity of the wafer W for which the atmosphere needs to be adjusted.

In the substrate processing apparatus (the processing unit 16) according to the embodiment, the first gas supply 44 is connected to the top plate 41 above the central portion of the substrate (the wafer W), and the second gas supply 45 is connected to the top plate 41 above the outer periphery of the substrate (the wafer W). Accordingly, it is possible to more evenly supply the atmosphere adjusting gas to the first space A1.

The substrate processing apparatus (the processing unit 16) according to the embodiment further includes the liquid supply 50 including the processing liquid nozzles 51 that discharge a processing liquid to the substrate (the wafer W). Then, the through hole 41a through which the processing liquid nozzles 51 are inserted is formed in the top plate 41. Accordingly, it is possible to smoothly supply the processing liquid to the wafer W within the first space A1 in which the atmosphere is adjusted.

In the substrate processing apparatus (the processing unit 16) according to the embodiment, the first gas supply 44 is connected to an inner wall of the through hole 41*a*. Accordingly, it is possible to form a gas curtain within the through hole 41*a*.

In the substrate processing apparatus (the processing unit 16) according to the embodiment, the through hole 41*a* has a slit shape extending from a position facing the central portion of the substrate (the wafer W) to a position facing the outer periphery of the substrate (the wafer W). Accordingly, it is possible to scan-move the processing liquid nozzles 51 within the through hole 41*a*.

The substrate processing apparatus (the processing unit 16) according to the embodiment further includes the scan top plate 60 that is disposed to cover the slit-shaped through hole 41*a*, and performs scanning above the substrate (the wafer W) in synchronization with the processing liquid nozzles 51. Accordingly, it is possible to suppress the inflow of air atmosphere from the second space A2 to the first space A1.

In the substrate processing apparatus (the processing unit 16) according to the embodiment, a gap between the top plate 41 and the scan top plate 60 has a labyrinth structure. This may cause occurrence of a pressure loss in the gap between the top plate 41 and the scan top plate 60, and thus, it is possible to further suppress the inflow of the air atmosphere from the second space A2 to the first space A1.

The substrate processing apparatus (the processing unit 16) according to the embodiment further includes the casing 20 that accommodates the substrate processing unit 30, the partition wall 40, and the liquid supply 50. Then, the second space A2 within the casing 20 has the air atmosphere. Accordingly, at the time of the liquid processing of the wafer W, it is possible to reduce the usage amount of the atmosphere adjusting gas.

In the substrate processing apparatus (the processing unit 16) according to the embodiment, the flow rate of the atmosphere adjusting gas supplied from the first gas supply 44 is larger than the flow rate of the atmosphere adjusting gas supplied from the second gas supply 45. Accordingly, it is possible to uniformly supply the atmosphere adjusting gas from the first gas supply 44 having a wider opening than the second gas supply 45, to the first space A1.

In the substrate processing system 1 according to the embodiment, a plurality of above described substrate processing apparatuses (the processing units 16) is arranged. The substrate processing system 1 includes a common conveyance path (the conveyance section 15) that is adjacent to the plurality of substrate processing apparatuses and is provided with a conveyance mechanism (the substrate conveyance device 17) that conveys the substrate (the wafer W) to each of the substrate processing apparatuses. Accordingly, it is possible to realize the substrate processing system 1 capable of reducing the usage amount of the atmosphere adjusting gas at the time of the liquid processing of the wafer W.

The substrate processing system 1 according to the embodiment further includes the third gas supply that supplies the atmosphere adjusting gas that adjusts the atmosphere to the common conveyance path (the conveyance section 15). Accordingly, within the processing unit 16 into which the wafer W is being carried, the atmosphere of the first space A1 may be continuously adjusted to a predetermined condition.

<Details of Liquid Processing>

Figure 7:
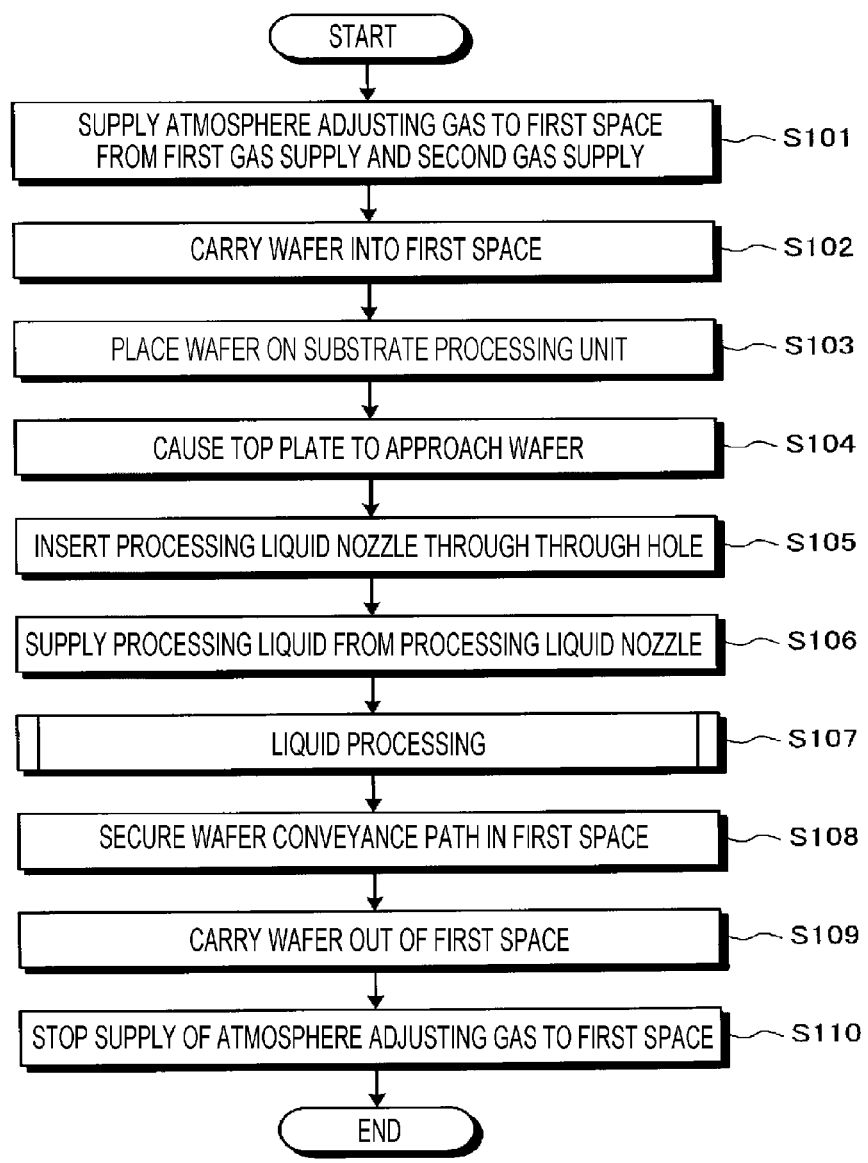
FIG. 7 is a flow chart illustrating a processing sequence of the entire liquid processing according to the embodiment.

Subsequently, descriptions will be made on details of a liquid processing according to the embodiment with reference to FIG. 7 and FIG. 8. FIG. 7 is a flow chart illustrating a processing sequence of the entire liquid processing according to the embodiment.

Figure 8:
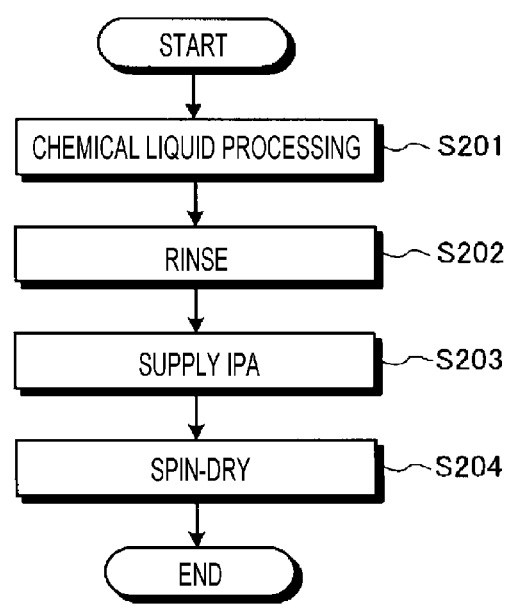
FIG. 8 is a flow chart illustrating a detailed processing sequence of the liquid processing according to the embodiment.

The liquid processing illustrated in FIG. 7 and FIG. 8 is executed when the controller 18 reads a program installed from a recording medium according to the embodiment to the storage 19, and controls, for example, the conveyance section 12 or the conveyance section 15, and the processing unit 16 on the basis of the read command.

First, the controller 18 controls the processing unit 16 to supply an atmosphere adjusting gas from the first gas supply 44 and the second gas supply 45 to the first space A1 separated by the partition wall 40 (step S101).

Subsequently, the controller 18 controls the substrate conveyance device 13 and the substrate conveyance device 17 so that the wafer W is carried into the first space A1 within the processing unit 16 from the carrier C, via the substrate conveyance device 13, the delivery unit 14, and the substrate conveyance device 17 (step S102).

Next, the controller 18 controls the substrate conveyance device 17 and the processing unit 16 to place the wafer W on the substrate processing unit 30 (step S103). For example, this step S103 is performed by receiving the wafer W loaded at a position above the substrate holder 31 by the support 32 moved upwards, moving the wafer W downwards, and placing the wafer W on the substrate holder 31.

Next, the controller 18 controls the processing unit 16 to cause the top plate 41 to approach the wafer W (step S104). In this step S104, the scan top plate 60 may be moved in synchronization with the top plate 41.

Next, the controller 18 controls the liquid supply 50 of the processing unit 16 so that the processing liquid nozzles 51 are inserted through the through hole 41*a* of the top plate 41 (step S105). Then, the controller 18 controls the liquid supply 50 to supply a processing liquid from the processing liquid nozzles 51 to the wafer W (step S106).

Next, the controller 18 controls the substrate processing unit 30 to perform the liquid processing on the wafer W (step S107). For example, this step S107 is performed by rotating the wafer W through rotation of the substrate holder 31, and moving the processing liquid supplied to the wafer W to the outer periphery side. Details of this step S107 will be described below.

Next, the controller 18 controls the partition wall 40 to secure a conveyance path of the wafer W in the first space A1 (step S108). For example, this step S108 is performed by retracting the top plate 41 upwards from the conveyance path of the wafer W.

Next, the controller 18 controls the substrate processing unit 30, the substrate conveyance device 17, and the substrate conveyance device 13 so that the wafer W is carried from the first space A1 within the processing unit 16 to the carrier C via the substrate conveyance device 17, the delivery unit 14, and the substrate conveyance device 13 (step S109).

Finally, the controller 18 controls the first gas supply 44 and the second gas supply 45 to stop the supply of the atmosphere adjusting gas to the first space A1 separated by the partition wall 40 (step S110), and completes the processing.

FIG. 8 is a flow chart illustrating a detailed processing sequence of the liquid processing (the above described step S107) according to the embodiment.

In the liquid processing in the embodiment, first, a chemical liquid processing is performed with a predetermined chemical liquid L1 (step S201). For example, such a chemical liquid processing is performed by supplying a chemical liquid that is an acid-based processing liquid such as DHF or an alkaline-based processing liquid such as SC1 from the processing liquid nozzles 51 to the wafer W.

Next, rinsing is performed with a predetermined rinse liquid L2 (step S202). For example, such rinsing is performed by supplying a rinse liquid such as DIW from the processing liquid nozzles 51 to the wafer W.

Next, IPA is supplied to the wafer W by using the processing liquid nozzles 51 (step S203). Finally, the wafer W to which the IPA is supplied is rotated so that the wafer W is spin-dried (step S204), and then the processing is completed. In the above described steps S202 and S203, the liquid processing may be performed while the supplied rinse liquid L2 or IPA is in contact with the top plate 41.

The substrate processing method according to the embodiment includes supplying an atmosphere adjusting gas, carrying the substrate (the wafer W) into the first space A1, placing the substrate (the wafer W) on the substrate processing unit 30, and performing a liquid processing. In the supplying of the atmosphere adjusting gas, the atmosphere adjusting gas that adjusts atmosphere is supplied from two gas supplies (the first gas supply 44 and the second gas supply 45) to the first space A1 from the carry-in/out port 21 through which the substrate (the wafer W) is loaded to the substrate processing unit 30 where the liquid processing is performed on the substrate. In the performing of the liquid processing, the liquid processing is performed on the substrate (the wafer W) by using the liquid supply 50 disposed in the second space A2 separated by the partition wall 40 from the first space A1. Accordingly, at the time of the liquid processing of the wafer W, it is possible to reduce the usage amount of the atmosphere adjusting gas.

According to the present disclosure, it is possible to reduce the usage amount of the atmosphere adjusting gas when the substrate is processed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a casing including a substrate holder configured to mount a substrate and perform a liquid processing on the substrate;
a partition wall configured to separate a first space from a carry-in/out port through which the substrate is loaded to the casing, and a second space other than the first space;
a first gas discharge nozzle connected to the partition wall and configured to supply an atmosphere adjusting gas to the first space; and
a second gas discharge nozzle connected to a place different from the first gas discharge nozzle in the partition wall and configured to supply the atmosphere adjusting gas to the first space.

2. The substrate processing apparatus according to claim 1, wherein the first gas discharge nozzle and the second gas discharge nozzle are connected to positions in the partition wall facing the substrate.

3. The substrate processing apparatus according to claim 2, wherein the partition wall includes a top plate that covers a top side of the substrate, and a side wall that surrounds a lateral side of the substrate, and
the first gas discharge nozzle and the second gas discharge nozzle are connected to the top plate of the partition wall.

4. The substrate processing apparatus according to claim 3, further comprising:
a liquid supply including a processing liquid nozzle configured to discharge a processing liquid to the substrate,
wherein the top plate has a through hole through which the processing liquid nozzle is inserted.

5. The substrate processing apparatus according to claim 4,
wherein the second space within the casing is under an air atmosphere.

6. The substrate processing apparatus according to claim 4, wherein the first gas discharge nozzle is connected to an inner wall of the through hole.

7. The substrate processing apparatus according to claim 6, wherein the through hole has a slit shape extending from a position facing the central portion of the substrate to a position facing the outer peripheral portion of the substrate.

8. The substrate processing apparatus according to claim 7, further comprising: a scan top plate disposed to cover the slit-shaped through hole, and configured to perform scanning above the substrate in synchronization with the processing liquid nozzle.

9. The substrate processing apparatus according to claim 8, wherein a gap between the top plate and the scan top plate has a labyrinth structure.

10. The substrate processing apparatus according to claim 3, wherein the first gas discharge nozzle is connected to the top plate of the partition wall above a central portion of the substrate, and the second gas discharge nozzle is connected to the top plate of the partition wall above an outer peripheral portion of the substrate.

11. The substrate processing apparatus according to claim 10, wherein a flow rate of the atmosphere adjusting gas supplied from the first gas discharge nozzle is larger than a flow rate of the atmosphere adjusting gas supplied from the second gas discharge nozzle.

12. The substrate processing apparatus according to claim 10, further comprising:
a liquid supply including a processing liquid nozzle configured to discharge a processing liquid to the substrate,
wherein the top plate of the partition wall has a through hole through which the processing liquid nozzle is inserted.

13. The substrate processing apparatus according to claim 12, wherein the first gas discharge nozzle is connected to an inner wall of the through hole.

14. The substrate processing apparatus according to claim 13, wherein the through hole has a slit shape that extends from a position facing the central portion of the substrate to a position facing the outer peripheral portion of the substrate.

15. The substrate processing apparatus according to claim 14, further comprising:

a scan top plate disposed to cover the slit-shaped through hole, and configured to perform scanning above the substrate in synchronization with the processing liquid nozzle.

16. The substrate processing apparatus according to claim 12, wherein the second space within the casing is under an air atmosphere.

17. The substrate processing apparatus according to claim 1, wherein a flow rate of the atmosphere adjusting gas supplied from the first gas discharge nozzle is larger than a flow rate of the atmosphere adjusting gas supplied from the second gas discharge nozzle.

18. A substrate processing system comprising:
a plurality of substrate processing apparatuses according to claim 1; and
a common conveyance path disposed adjacent to the plurality of substrate processing apparatuses, and provided with a conveyor that conveys a substrate to each of the substrate processing apparatuses.

19. The substrate processing system according to claim 18, further comprising:
a third gas supply configured to supply an atmosphere adjusting gas to the common conveyance path.

20. A substrate processing method comprising:
supplying an atmosphere adjusting gas from a first gas discharge nozzle connected to a partition wall and a second gas discharge nozzle connected to a place on the partition wall different from the first gas discharge nozzle to a first space separated from a carry-in/out port through which a substrate is loaded by the partition wall in a casing including a substrate holder configured to mount the substrate where a liquid processing is performed on the substrate;
carrying the substrate into the first space;
placing the substrate on the substrate holder; and
performing the liquid processing on the substrate by using a liquid supply disposed in a second space separated from the first space by the partition wall.

* * * * *